US010241164B2

(12) United States Patent
Fischer et al.

(10) Patent No.: US 10,241,164 B2
(45) Date of Patent: Mar. 26, 2019

(54) STATUS ACQUISITION OF A RF COIL ON OR IN A MAGNETIC RESONANCE DEVICE

(71) Applicants: Hubertus Fischer, Bamberg (DE); Volker Matschl, Bamberg (DE); Helmut Stark, Erlangen (DE); Johann Sukkau, Herzogenaurach (DE)

(72) Inventors: Hubertus Fischer, Bamberg (DE); Volker Matschl, Bamberg (DE); Helmut Stark, Erlangen (DE); Johann Sukkau, Herzogenaurach (DE)

(73) Assignee: Siemens Aktiengesellschaft, München (DE)

( * ) Notice: Subject to any disclaimer, the term of this patent is extended or adjusted under 35 U.S.C. 154(b) by 584 days.

(21) Appl. No.: 14/976,003

(22) Filed: Dec. 21, 2015

(65) Prior Publication Data

US 2016/0178713 A1   Jun. 23, 2016

(30) Foreign Application Priority Data

Dec. 22, 2014   (DE) .................. 10 2014 226 761

(51) Int. Cl.
| | | |
|---|---|---|
| G01V 3/00 | (2006.01) | |
| G01R 33/36 | (2006.01) | |
| G01R 33/28 | (2006.01) | |
| G01R 31/06 | (2006.01) | |
| G01R 31/28 | (2006.01) | |
| G01R 35/00 | (2006.01) | |

(52) U.S. Cl.
CPC ............. *G01R 33/36* (2013.01); *G01R 31/06* (2013.01); *G01R 33/28* (2013.01); *G01R 31/2822* (2013.01); *G01R 35/00* (2013.01)

(58) Field of Classification Search
USPC ......................................................... 324/322
See application file for complete search history.

(56) References Cited

U.S. PATENT DOCUMENTS

| | | | | |
|---|---|---|---|---|
| 6,362,622 B1* | 3/2002 | Stauber | .................. | G01R 33/36 324/318 |
| 6,545,475 B2* | 4/2003 | Kroeckel | ............. | G01R 33/341 324/318 |
| 7,230,425 B2 | 6/2007 | Leussler | | |
| 2006/0232275 A1 | 10/2006 | Leussler | | |

(Continued)

FOREIGN PATENT DOCUMENTS

| | | |
|---|---|---|
| CN | 103376429 A | 10/2013 |
| DE | 102010010820 A1 | 9/2011 |

(Continued)

OTHER PUBLICATIONS

German Office action for related German Application No. 10 2014 226 761.7 dated Aug. 24, 2015, with English Translation.

(Continued)

*Primary Examiner* — Rodney E Fuller
(74) *Attorney, Agent, or Firm* — Lempia Summerfield Katz LLC

(57) ABSTRACT

A device and a method are provided for status acquisition of a RF coil on or in a magnetic resonance device. The device may be arranged on the RF coil and comprises a status acquisition unit. The status unit is configured to acquire a status of the RF coil and to generate a status-dependent output signal.

20 Claims, 5 Drawing Sheets

(56) References Cited

U.S. PATENT DOCUMENTS

| | | | | |
|---|---|---|---|---|
| 2011/0221441 A1* | 9/2011 | Baumgartl | ......... | G01R 33/3415 |
| | | | | 324/322 |
| 2013/0057284 A1* | 3/2013 | Schmidt | ............... | G01R 33/341 |
| | | | | 324/322 |
| 2013/0119981 A1* | 5/2013 | Choi | ...................... | G01R 33/36 |
| | | | | 324/307 |
| 2013/0147479 A1* | 6/2013 | Bielmeier | .............. | G01R 33/32 |
| | | | | 324/309 |
| 2013/0271129 A1* | 10/2013 | Kess | ...................... | G01R 33/36 |
| | | | | 324/307 |
| 2017/0074953 A1* | 3/2017 | Demharter | ............. | G01R 33/36 |

FOREIGN PATENT DOCUMENTS

| | | |
|---|---|---|
| DE | 102011004913 A1 | 9/2012 |
| DE | 102012206066 A1 | 10/2013 |
| EP | 2362235 A1 | 8/2011 |

OTHER PUBLICATIONS

Chinese Office Action for Chinese Patent Application No. 2015109696732, dated Jan. 26, 2018, with English Translation.

* cited by examiner

FIG 4
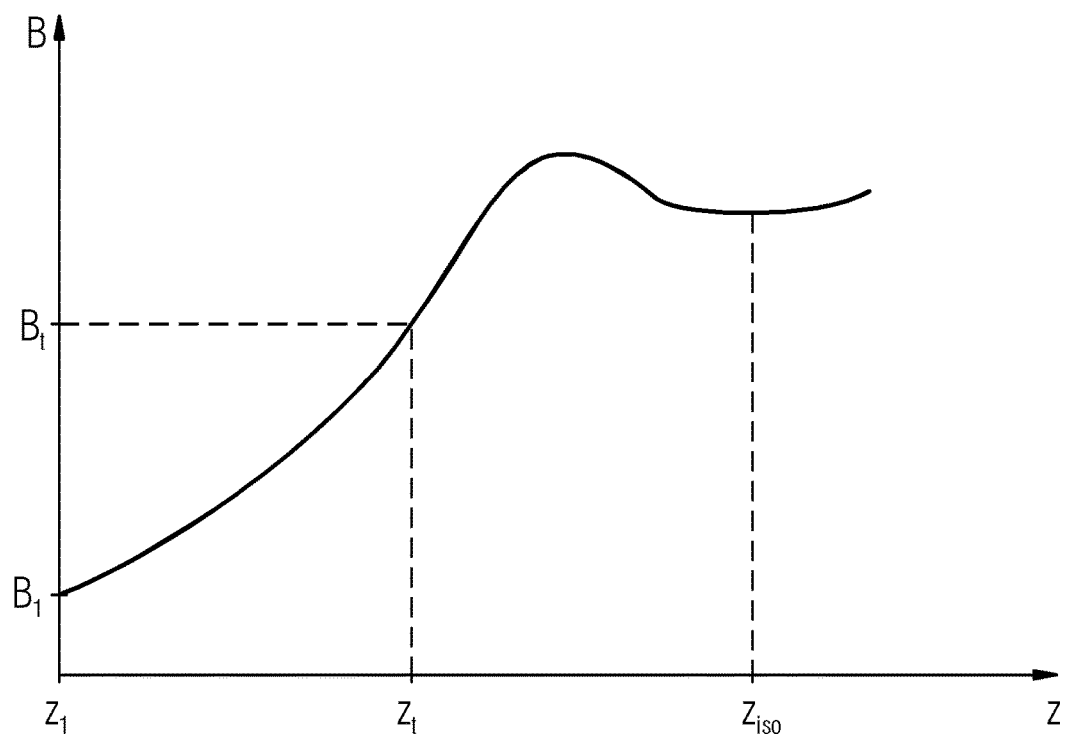
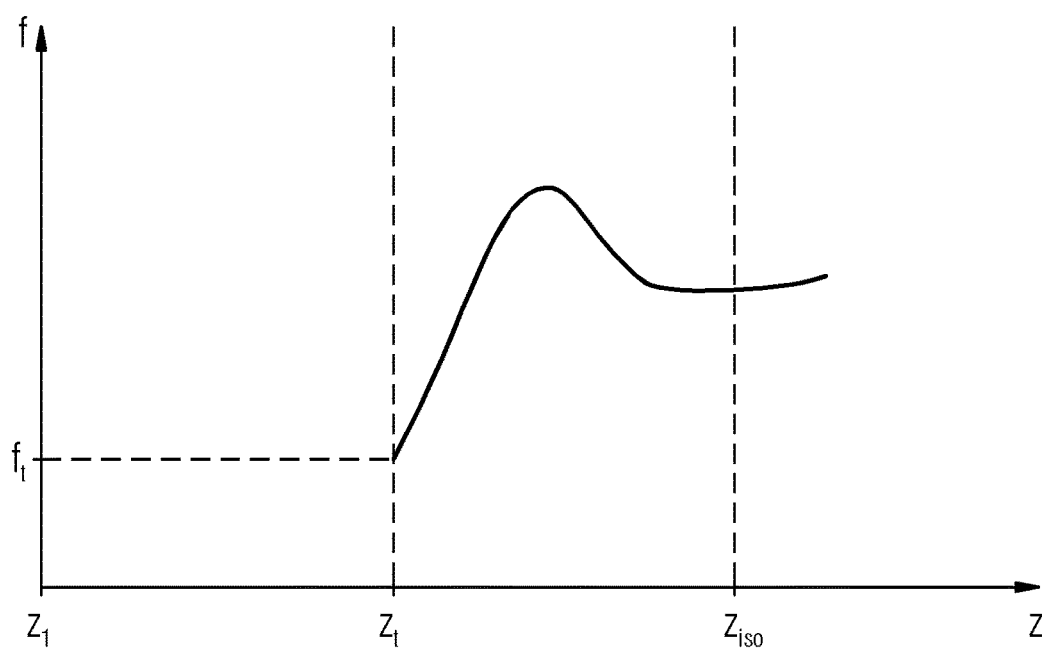

STATUS ACQUISITION OF A RF COIL ON OR IN A MAGNETIC RESONANCE DEVICE

CROSS-REFERENCE TO RELATED APPLICATIONS

This application claims the benefit of DE 10 2014 226 761.7, filed on Dec. 22, 2014, that is hereby incorporated by reference in its entirety.

TECHNICAL FIELD

The present embodiments relate to status acquisition of a RF coil on or in a magnetic resonance device.

BACKGROUND

Imaging methods represent important tools in medical technology. Magnetic resonance tomography (MRT) is thus distinguished in the field of clinical sectional imaging by the high and variable soft-tissue contrasts. A magnetic resonance device includes RF coils that may be used for sending and receiving radio-frequency electromagnetic signals. Different types of RF coils may be differentiated in this situation. A body coil is normally fixedly integrated in the magnetic resonance device. Local coils on the other hand, also referred to as surface coils, are often configured such that the local coils may be attached to the magnetic resonance device. RF receive coils may be positioned close to the body surface of the patient and therefore provide a high signal-to-noise ratio and a high spatial resolution. The plug-in capability for a local coil makes it possible to employ different forms of coil matched to particular examination issues, for example a special head coil for imaging a head or a special knee coil for imaging a knee.

The attachment of a local coil is a manual activity on the part of a human operator and is therefore susceptible to errors to a certain degree. A local coil that is placed onto the patient examination table or is positioned on the body of the patient, introduced into the magnetic resonance device, and that is inadvertently not attached or not completely attached, may then naturally not deliver any measurement signals but may also result in damage to the local coil or to the safety devices incorporated there. This may generate high returns and servicing costs as well as downtimes for the radiologist or for the hospital.

A coil detection facility employing RFID tags is proposed in DE 10 2012 206 066 A1. It would, however, be necessary in DE 10 2012 206 066 for further electronics and system integration to be implemented on the magnetic resonance device. Radio-frequency transponders are similarly proposed in U.S. Pat. No. 7,230,425 B2, with similar disadvantages and costs.

SUMMARY AND DESCRIPTION

The scope of the present invention is defined solely by the appended claims and is not affected to any degree by the statements within this summary. The present embodiments may obviate one or more of the drawbacks or limitations in the related art.

A device for status acquisition of a RF coil may be arranged on a RF coil on or in a magnetic resonance device and may include a status acquisition unit. The device is configured to acquire a status of a RF coil and to generate a status-dependent output signal. Useful information may be made available to the operating staff.

The device may be arranged on a RF coil. The device may be mounted releasably on the RF coil or may be connected fixedly to the RF coil. The mounting may be effected by a fixing unit, for example a clip connection. The device may be mounted on the RF coil for status acquisition purposes. For example, during the period in which no status acquisition is taking place, no mounting on the RF coil is necessary, therefore the device may be removed. The device may be implemented as a small and modular unit. A RF coil which is already present may be cost-effectively retrofitted with the device. A retrofit may be done by mounting the device in or on the RF coil, in particular in or on local transmit coils that are particularly at risk on account of resonance and/or freely positionable coils and/or other removable coils.

The acquired status may relate to one or more characteristics of the RF coil, for example the connection status of the RF coil to the magnetic resonance device and/or the position of the RF coil relative to the magnetic resonance device. The position may be ascertained for example by a coil position sensor. Furthermore, further statuses or characteristics are also conceivable. The acquisition of further statuses or characteristics may be helpful. For example, a temperature status sensor may provide information as to whether a local coil is situated in the vicinity of a living being.

Depending on the status acquired, an output signal may be generated. The output signal may be used to draw the attention of an operator of the magnetic resonance device to a critical situation. The output signal need not be associated with a physical flow of energy. For example, silence, the absence of an acoustic wave, darkness, or the absence of an electromagnetic wave, may also signal the status of the RF coil to any operating staff. Such a type of passive output signal would normally be chosen to indicate a noncritical status. An active output signal may consequently be understood as being a signal which includes a physical flow of energy. A noncritical status may naturally also be communicated by an active output signal, for example by a green control lamp.

In an embodiment, the status acquisition unit includes at least one magnetic field sensor which is configured to acquire at least one magnetic field characteristic.

A magnetic field may for example be described as a vector field of its magnetic field strength. For example, a field strength vector may be assigned to every point of a space. A vector may be characterized by a magnitude and a direction. The magnitude and/or the direction of a field strength vector H at a spatial point for example may thus be considered as at least one magnetic field characteristic, or also any possible variables dependent thereon, such as for example the magnetic flux density B that is linked to the magnetic field strength by way of the magnetic permeability µ of the present material. Naturally, at least one magnetic field characteristic may also include characteristics that are present at various space points and depend on the magnetic field.

The at least one magnetic field sensor advantageously acquires a local magnetic field characteristic localized directly on the RF coil and/or in the immediate vicinity thereof. A particularly easy positional determination of the RF coil relative to the magnetic resonance device is thereby possible, as is explained in the following: The magnetic field generated by a magnetic resonance device is determined by a cylindrical superconducting main magnet. The magnetic field may be constant temporally, but not spatially, because the strength thereof drops off from the center point of the main magnet towards the outside, primarily in the direction of the axis of symmetry of the main magnet. As a result of the acquisition of the magnetic field at a particular location, it is possible to conclude the position of the RF coil relative to the magnetic resonance device.

The status-dependent output signal may be dependent on a threshold value being exceeded or undershot and/or on a change in a magnetic field characteristic that may be acquired by the at least one magnetic field sensor.

If for example a patient examination table transports a patient having a local coil arranged on him in the direction of the center point of the main magnet parallel to the axis of symmetry of the cylindrical main magnet, then the magnetic field strength may rise continuously at the location of the local coil during the transport operation. As soon as the magnetic field strength acquired by the at least one magnetic field sensor exceeds a particular threshold value, where applicable a particular output signal may be generated. The output signal, for example, is intended as a warning for the operator of the magnetic resonance device.

In an embodiment, the at least one magnetic field sensor includes at least one reed contact and/or at least one Hall sensor and/or at least one induction coil. These may be readily available, cost-effective and may be easily integrated. Other sensor types not mentioned here are also conceivable.

A combination of a plurality of sensors may be possible as well as a temporally limited successive activation of various sensors. A pulsed operation may be used to save energy.

In an embodiment, the status acquisition unit includes an output unit configured to output a status-dependent output signal. The output signal may be used to warn the operator of the magnetic resonance device that the RF coil is subjected to a magnetic field that may be excessively high.

Such an output signal may be an optical signal and/or an acoustic signal. An optical signal, such as flashing, may be generated for example by a light-emitting diode (LED); an acoustic signal, such as beeping, may be generated for example by an oscillating piezo element. The signal may be adjusted such that the signal may be perceived directly by the operating staff of the magnetic resonance device, for example during the positioning operation on the magnetic resonance device or on the patient examination table. Both examples advantageously have only a relatively low power requirement.

In an embodiment, the status-dependent output signal is a signal. The characteristic of the signal is dependent on the acquired status.

In the case of an acoustic sound being output for example, a variation of the volume and/or of the pitch and/or of the repetition frequency of the sound in order to characterize the acquired status, for example a measured magnetic field characteristic, is thus conceivable. It is possible for instance in the event of acquisition of a low magnetic field strength for a quiet sound to be output that possibly corresponds to a location of a local coil far outside a magnetic resonance device. If the local coil is moved in the direction of the center point of the main magnet, with the result that the local magnetic field increases at the local coil, then the operator of the magnetic resonance device may be warned by a rising volume of the sound output.

In addition, the status acquisition unit may include a connection status acquisition unit configured to acquire the connection status of the RF coil.

The connection status may be the status that characterizes the connection or the link of the RF coil to the magnetic resonance device. The connection status of the RF coil may be a plug-in or contacting status of the RF coil on the magnetic resonance device. The connection status acquisition unit may be connected to the RF coil by an interface that enables access to information or signals that indicate the connection status of the RF coil. The output unit may only output a status-dependent output signal if the RF coil is not plugged in. If, for example, a local coil is moved into a magnetic resonance device, the operator of the magnetic resonance device is only warned if the coil is not connected to the magnetic resonance device, for example if there is an actual threat of danger.

The connection status acquisition unit is configured such that the status acquisition unit is switched off by way of an electrical voltage signal delivered to the device in the plugged-in or contacted state, and/or the output unit is deactivated. Alternatively, a mechanical switch-off or deactivation would also be conceivable, for example whereby a pin of the plug-in connection for the local coil unit switches over an electrical switch on the magnetic resonance device. Furthermore, other possibilities for acquiring the connection status of the RF coil are also conceivable.

The device is configured to output an output signal when a RF coil is not plugged in and on receipt of a measurement signal that represents at least one particular magnetic field characteristic, for example, when a threshold value for a magnetic field strength is exceeded.

In an embodiment, the status acquisition unit includes an energy storage device. The energy storage device may provide that a necessary supply is guaranteed in the non-connected status.

The energy storage device may be implemented for example in the form of at least one rechargeable accumulator, for example in a largely nonmagnetic embodiment, and/or a battery, for example a long-life battery, and/or a capacitor, for example a double-layer capacitor having a high capacity.

A possibility for supplying energy exists inter alia by way of induced voltages, for example, in a shielding cabin of the magnetic resonance device or during the movement of the RF coil in the magnetic field of the main magnet, possibly by an electrolytic capacitor. In addition, an energy supply may be effected by way of one or more solar cells and/or one or more electrical contacts, in particular in the connected status by way of a plug-in connection of the RF coil. The energy supplied may be used for charging the energy storage device and/or for the direct operation of the device.

Furthermore, the device may include an indicator, for example a light-emitting diode that serves to inform the operator about the charge state of the energy storage device. The operator may thus recognize a charge state that is too low to enable correct functioning of the device and take countermeasures.

In a further embodiment, the electronics of the device may be at least partially deactivated. If for example, the acquired magnetic field strength is lower than normally present in the region of a patient examination table of a magnetic resonance device, at least one part of the electronics may be switched off and/or the output unit may be deactivated to reduce the energy consumption of the device.

A further possibility for saving energy exists through an embodiment wherein the status acquisition unit is configured in order to perform a discontinuous acquisition. Therefore the status of the RF coil is not being acquired constantly but, for example, using measurements at intervals of several seconds.

In an embodiment, the status acquisition unit is configured such that the output of the status-dependent output signal may be suspended for a specific waiting time following acquisition of a change in status of the RF coil.

The introduction of the RF coil into a magnetic field may constitute a change in status that may be acquired by at least one magnetic field sensor. Such an introduction may take place in the context of preparation for a measurement, for instance if the RF coil, for example a local coil, is fitted on a patient who is lying on a patient examination table since a strong magnetic field may already be present at the location of the patient examination table. At the point in time when the coil is fitted on the body of the patient, the coil of the connector is not necessarily already plugged in to the magnetic resonance device. If an alarm were then triggered immediately after the introduction of the coil to alert the operator to the absence of a plugged-in connection, the operator would possibly perceive this as disruptive. During the period in which the output of the status-dependent output signal does not happen following introduction into the magnetic field, the operator may make the plugged-in connection without being unnecessarily inconvenienced. The same applies to the process after completion of the measurement, wherein the plug-in connection between RF coil and magnetic resonance device may already be released before the coil is removed from the magnetic field area of the magnetic resonance device. A waiting time following the change in status, here resulting from the change in the connection status of the RF coil, may also have an advantageous effect here.

In an embodiment, the output unit is configured to generate a status-dependent output signal and to communicate the output signal to an external receive unit of a magnetic resonance device. The output signal may be used to control the magnetic resonance device, for example by blocking the imaging measurement. The reliability of the magnetic resonance device is thereby increased.

The signal transfer may take place for example by electromagnetic waves, in particular IR or RF waves, that may be generated by the output unit and received by a possible receive unit on the device side. Other transfer methods, such as for example ultrasound technology, may be used.

A RF coil includes a device for status acquisition of the RF coil. In addition to the described retrofitting of existing RF coils, the device may naturally also be arranged or installed in RF coils from the outset.

The advantages of the RF coil correspond to the advantages of the device for status acquisition of a RF coil on or in a magnetic resonance device, that are set forth in detail above. Features, advantages or alternative embodiments mentioned here may likewise also be transferred to the other claimed subject matters and vice versa.

In addition, embodiments include a magnetic resonance device that includes a device for status acquisition of a RF coil on or in the magnetic resonance device. If a particular embodiment of the magnetic resonance device is given, the possibility exists to adjust the device more precisely thereto, for example through the use of optimized equipment-specific trigger threshold values for the magnetic field strength.

In an embodiment, the magnetic resonance device includes a receive unit, wherein the receive unit is configured to receive the status-dependent output signal. The received signal may be forwarded to the magnetic resonance device for further processing.

Furthermore, certain embodiments include a method for status acquisition of a RF coil on or in a magnetic resonance device. The advantages of the method correspond to the advantages of the device for status acquisition of a RF coil on or in a magnetic resonance device, that are set forth in detail above. Features, advantages or alternative embodiments mentioned here may likewise also be transferred to the other claimed subject matters and vice versa.

A method for status acquisition of a RF coil on or in a magnetic resonance device includes the following acts: a) acquisition of at least one signal that characterizes a status of a RF coil, and b) generation of a status-dependent output signal, wherein the status-dependent output signal from act b) is dependent on the signal acquired in act a).

The output signal may assist the operating staff in carrying out the magnetic resonance tomography.

The acquisition in act a) may for example take place after the RF coil has been arranged on an object under examination, in particular a patient. In this situation the object under examination may move, for example while a patient examination table or patient couch is being transported, or may also be stationary. The at least one signal is normally received by one or more sensors and further processed, in particular to derive a status therefrom that describes the RF coil. Depending thereon, an output may in turn be generated that signals the ascertained status.

In an embodiment, the acts a) and b) are carried out repeatedly, in particular continuously. Accordingly, the at least one status may be ascertained not only once but time and time again or constantly, for example without any temporal interruption.

In an embodiment, the at least one signal acquired in act a) is dependent on a magnetic field characteristic, such as for instance the strength of the magnetic field or the magnetic flux density in the acquisition field of any magnetic field sensors. The acquisition field may be localized at the location of the RF coil and/or in the immediately vicinity thereof.

In an embodiment, the at least one signal acquired in act a) is dependent on a connection status, in particular a plug-in status, of the RF coil. It is thereby possible for example to check whether the RF coil has been connected to the magnetic resonance device.

In an embodiment, an active output signal is only generated in act b) if the RF coil is not connected and the signal dependent on a magnetic field characteristic exceeds or undershoots at least one threshold value. This situation may describe a particularly critical status of the RF coil that may result in damage to the RF coil.

BRIEF DESCRIPTION OF THE DRAWINGS

Embodiments will be described and explained in detail in the following with reference to the exemplary embodiments illustrated in the figures.

FIG. 4 depicts two diagrams of example local profiles of magnetic flux density and corresponding acoustic output signal.

DETAILED DESCRIPTION

Figure 1:
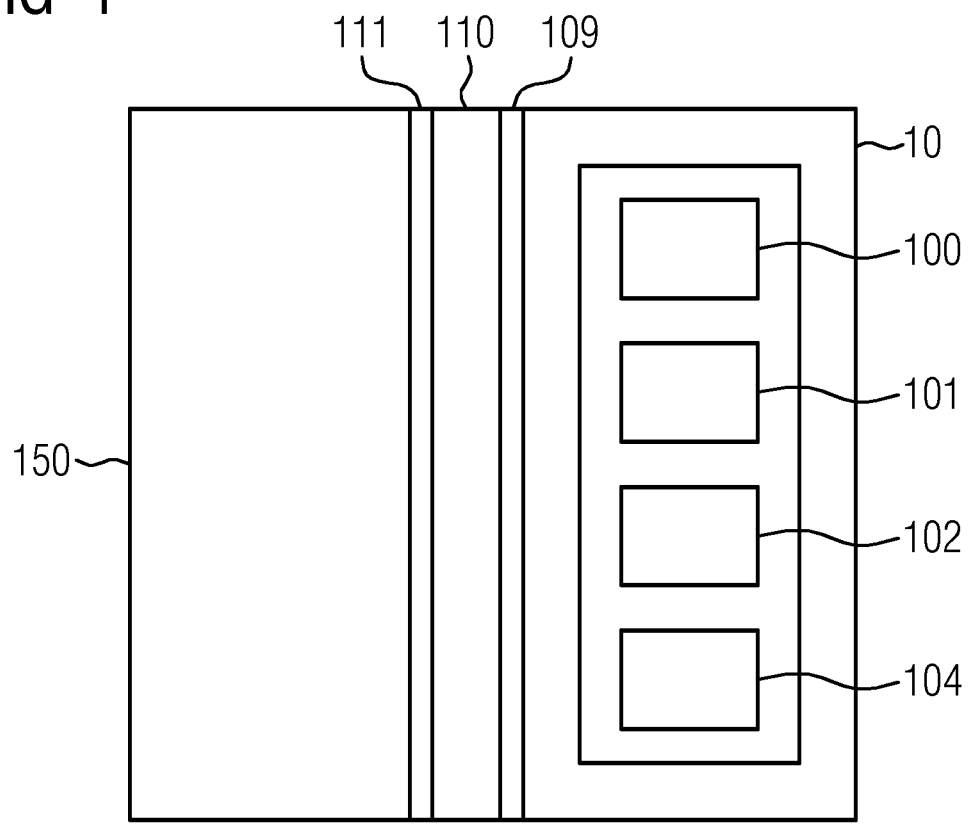
FIG. 1 depicts embodiments of a device.

A device 10 that is fitted to a RF coil is illustrated schematically in FIG. 1. The arrangement in question may be removable by a fixing unit 110. The device includes a status acquisition unit 100 that is configured to acquire a status of a RF coil, in particular a local or surface coil, and to generate a status-dependent output signal.

The status acquisition unit 100 may include a magnetic field sensor 101 to acquire at least one magnetic field characteristic. The magnetic field characteristic may for example be the strength and/or the direction of the magnetic field at a particular point relative to the device. The magnetic field sensor 101 may for example be implemented as a reed contact and/or a Hall sensor and/or an induction coil. The processing of the received signal may be carried out by an electronic circuit, not illustrated here in detail, for example by processors. An output signal may be generated in the event of a threshold value being exceeded or undershot and/or a change in an acquired magnetic field characteristic. The output may take place by way of an output unit 103. The output unit 103 may for instance generate an optical and/or acoustic signal, for example by a loudspeaker and/or a lamp.

In an embodiment, the status acquisition unit furthermore includes a connection status acquisition unit 102 by which the connection status to the magnetic resonance device may be acquired. Local coils may be coupled to the magnetic resonance device by plug-in connections. It is possible for an acquisition of the plug-in status. The plug-in connection may include one or more electrical contacts or pins. An exchange of data to acquire the connection status may take place through a device-side interface 109 that is connected to a coil-side interface 111 by way of the fixing unit 110.

The status acquisition unit may furthermore have an energy storage device 104, for example a battery, a rechargeable accumulator and/or a capacitor. To save energy, the electronics of the device may be configured to be capable of at least partial deactivation and/or to perform only a discontinuous acquisition.

Figure 2:
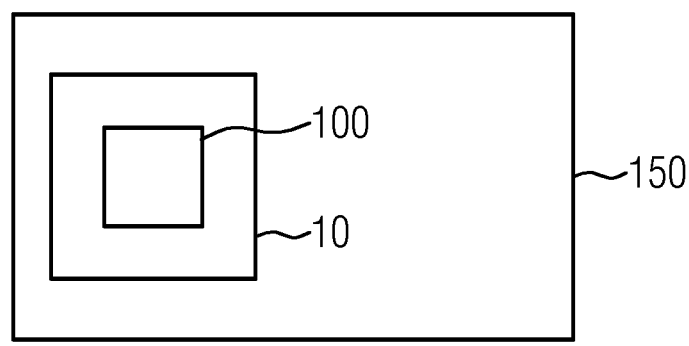
FIG. 2 depicts an embodiment of a RF coil that includes a status acquisition unit.

FIG. 2 depicts that the status acquisition unit may also be a fixed installed part of a RF coil.

Figure 3:
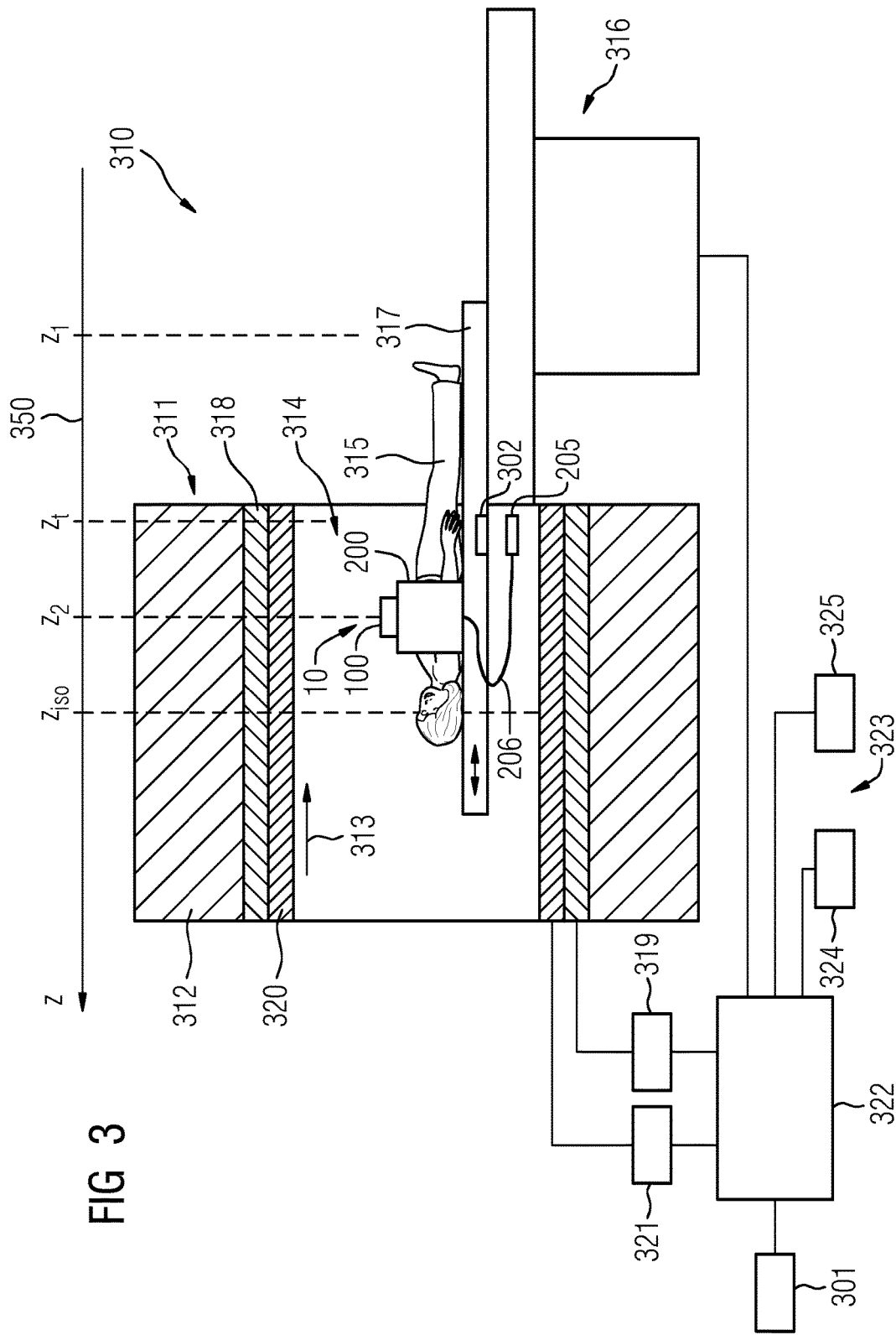
FIG. 3 depicts a magnetic resonance device according to one embodiment.

FIG. 3 schematically illustrates a magnetic resonance device 310. The magnetic resonance device 310 includes a magnet unit 311 that includes a superconducting main magnet 312 to generate a strong and temporally constant main magnetic field 313. In addition the magnetic resonance device 310 has a patient receiving area 314 for receiving a patient 315. The patient receiving area 314, in one embodiment, is cylindrical in form and enclosed in cylindrical fashion in a circumferential direction by the magnet unit 311. In principle, a design of the patient receiving area 314 differing therefrom is however conceivable at any time. The patient 315 may be slid by a patient positioning device 316 of the magnetic resonance device 310 parallel to a Z axis 350 into the patient receiving area 314. The patient positioning device 316 has a patient examination table 317 configured to be capable of movement within the patient receiving area 314.

The magnet unit 311 furthermore has a gradient coil unit 318 to generate magnetic field gradients that are used for position encoding during an imaging process. The gradient coil unit 318 is controlled by a gradient control unit 319 of the magnetic resonance device 310. The magnet unit 311 furthermore includes a radio-frequency antenna unit 320 that is configured, for example, as a body coil fixedly integrated into the magnetic resonance device 310. The radio-frequency antenna unit 320 is configured to excite atomic nuclei. The excitation occurs in the main magnetic field 313 generated by the main magnet 312. The strength of the main magnetic field 313 or of the magnetic flux density increases along the Z axis from the outside to the inside in the direction toward the center of the magnet, reaches a local maximum and then decreases slightly again to the isocenter at the point Z(iso), around which the magnetic field is approximately constant or homogeneous, as illustrated in FIG. 4. The radio-frequency antenna unit 320 is controlled by a radio-frequency antenna control unit 321 of the magnetic resonance device 310 and radiates radio-frequency magnetic resonance sequences into an examination space that is formed by a patient receiving area 314 of the magnetic resonance device 310. The radio-frequency antenna unit 320 is furthermore configured to receive magnetic resonance signals.

To control the main magnet 312, the gradient control unit 319, and radio-frequency antenna control unit 321, the magnetic resonance device 310 has a system control unit 322. The system control unit 322 provides central control for the magnetic resonance device 310, such as for example performing a predetermined imaging gradient echo sequence. In addition the system control unit 322 includes an evaluation unit, not illustrated in detail, to evaluate medical image data that is acquired during the magnetic resonance examination. The magnetic resonance device 310 furthermore includes a user interface 323 that is connected to the system control unit 322. Control information such as for example imaging parameters, as well as reconstructed magnetic resonance images, may be displayed on a display unit 324, for example on at least one monitor, of the user interface 323 for medical operating staff. The user interface 323 furthermore has an input unit 325, by which information and/or parameters may be entered by the medical operating staff during a measurement process.

Also shown in the example illustrated in FIG. 3 is a device 10 with the status acquisition unit 100 (not shown here), arranged on a RF coil, here a local coil in the chest region of the patient. The local coil has a connector 205 that is connected by way of a cable 206 to the local coil. The connector 205 constitutes a coil-side interface with the patient examination table 317 and thereby also with the magnetic resonance device 310 that in turn includes a socket 302 into which the connector 205 may be plugged. In the example illustrated, the connection status is such that the RF coil is not plugged-in, which may result in the already described damage to the local coil or to the safety devices incorporated there. This connection status is acquired by a connection status acquisition unit that is integrated in the status acquisition unit 100.

Figure 6:
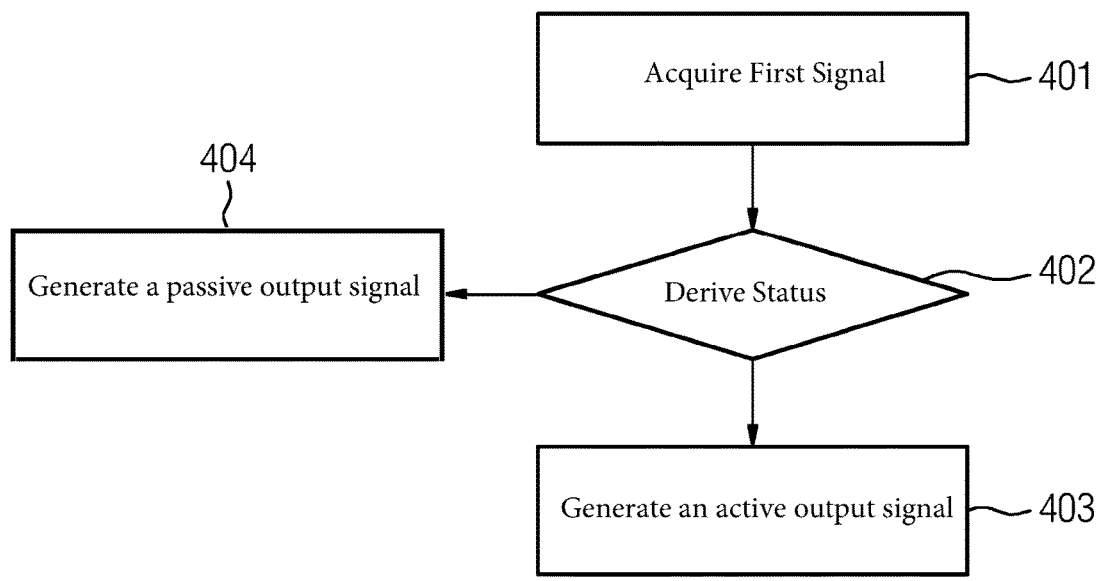
FIG. 6 depicts a flowchart of a method of an embodiment.

The local coil 200 and the status acquisition unit 100 are located in the Z direction at the point Z(2). In this case the patient examination table 317 has already been moved in the Z direction from the original location in which the patient has previously been positioned on the table. At an earlier point in time the local coil 200 and the status acquisition unit 100 may have been arranged at the Z position Z(1) by the operating staff. The magnitude of the magnetic flux density B prevailing there is illustrated in the upper diagram in FIG. 4 and is B(1). This local physical measured variable at the location of the local coil 200 is acquired by a magnetic field sensor that is integrated in the status acquisition unit 100. The acquisition corresponds to the process 401 as is illustrated in FIG. 6. If as a result the patient examination table is transported parallel to the Z axis in the direction of the isocenter, then the measured magnetic flux density also increases. The status acquisition unit 100 is configured such that until a particular threshold value B(T) is reached a passive output signal is output, no warning message is generated, thereby signaling to the operating staff that there is (as yet) no problem. The output of the passive output signal is illustrated in process 404 in FIG. 6. When a particular threshold value B(T) is reached at the point Z(T)

an active output signal is generated that is output by an output unit 103 that is illustrated in FIG. 4 by the process 403. In this example, the signal has a characteristic that is dependent on the measured magnetic field characteristic, for example the magnetic flux density. If the signal in question is an acoustic output signal, then this dependency may for example include that the pitch, e.g. the frequency, is increased as the acquired magnetic flux density B increases, as illustrated in the lower diagram in FIG. 4. Other correlations are also conceivable, such as for example an increasing volume. The acoustic signal is only output if the acquired connection status of the local coil 200 indicates that no plugged-in status is present. If, as illustrated in FIG. 3, the local coil is located at the point Z(2), then the operating staff are amply warned by the acoustic signal and thereby reminded to plug the connector 205 into the socket 302.

In addition or alternatively, remote transmission of an output signal to a receive unit 301 that is connected to the system control unit 322 is also possible. Various technologies are conceivable for the remote transmission, in particular those that are based on acoustic, for instance ultrasound technology, and/or electromagnetic, for instance infrared or radio-frequency technology, interaction. By the remote transmission 10, the existence of a possible critical situation may be communicated to the magnetic resonance device in order that the latter is able to take countermeasures, for example by preventing a further movement of the patient examination table and/or blocking the measurement process and/or warning the operating staff, for instance by way of the display unit 324.

As soon as the connector 205 is connected to the socket 302, the output signal is modified in such a manner that an acoustic warning signal no longer sounds or the magnetic resonance device 10 cancels possible countermeasures again, for example by unlocking possible blocking measures again. With reference to the diagram shown in FIG. 6, instead of an active output signal in 403, a passive output signal is generated in 404.

After completion of the measurement process, the local coil is normally unplugged again. For example the connector 205 is removed from the socket 302. After the decoupling or the disconnection, a waiting time may be set during which the status acquisition unit does not generate an output, for example even if the boundary conditions otherwise applied are met, such as for instance the fact that the measured magnetic flux density is above a particular threshold value. A false alarm or a useless signal possibly irritating the operating staff may thereby be prevented from possibly being output.

The magnetic resonance device 310 presented in the present exemplary embodiment may naturally include further components that magnetic resonance devices normally have. The general functioning of a magnetic resonance device 310 is moreover known to the person skilled in the art so that a detailed description of the general components may be dispensed with.

Figure 5:
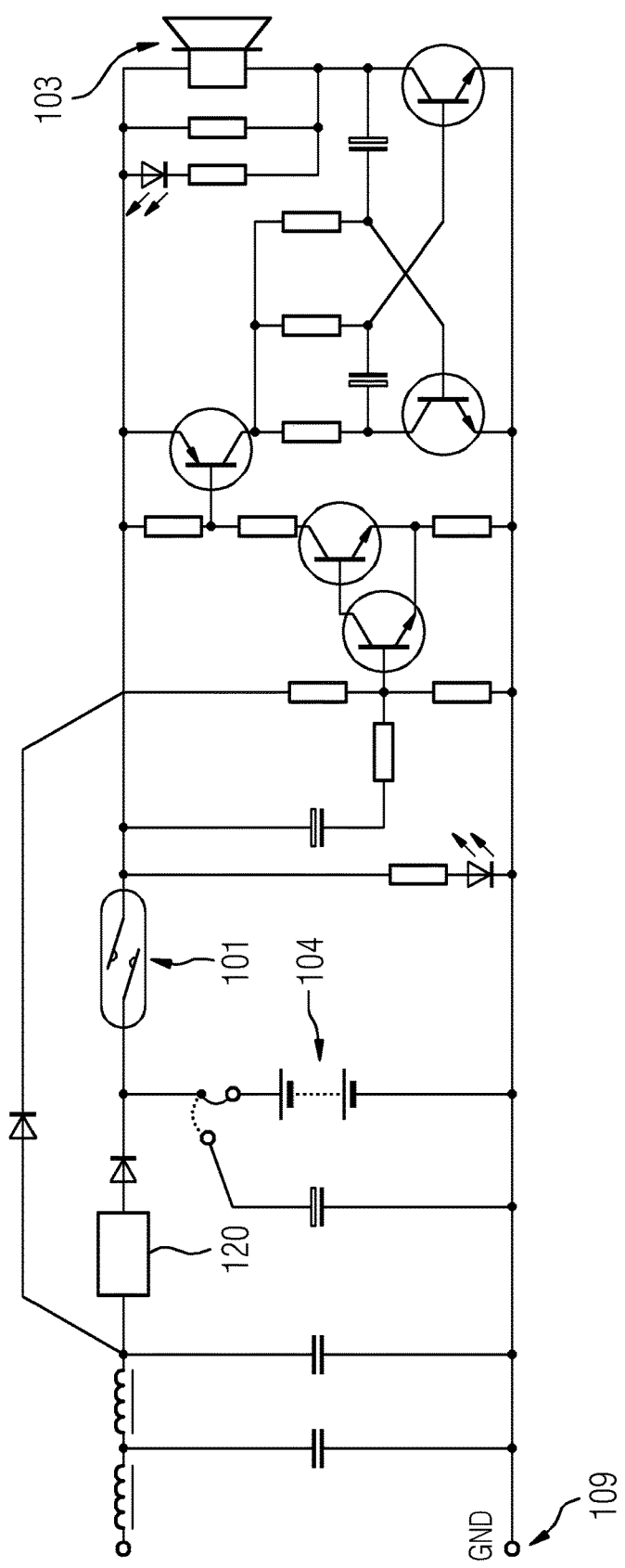
FIG. 5 depicts a circuit diagram of a device according to one embodiment.

FIG. 5 depicts a circuit diagram of a variant of the device that employs a reed contact as the magnetic field sensor 101. In addition to various electrical component parts, the device has a charging circuit 120, an accumulator as the energy storage device 104 and a piezo oscillator as the output unit 103. The device may be contacted to the RF coil by way of an interface 109.

FIG. 6 depicts a possible procedure for status acquisition of a RF coil on or in a magnetic resonance device. In a first process 401, at least one signal is acquired, from which the status of the RF coil is derived in a processing operation 402. Depending on the ascertained status, a passive output signal is generated in 404 or an active output signal is generated in 403.

The procedure may be carried out continuously, for instance the acquisition in 401 takes place temporally uninterrupted. It is also conceivable that the illustrated processes are processed in a loop, for example that the loop begins only after generation of an output signal in 403 or 404 or again with the signal acquisition in 401.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A system comprising:
a RF coil configured for use on or in a magnetic resonance device; and
a status acquisition unit arranged on the RF coil, wherein the status acquisition unit is configured to acquire a status of the RF coil and to generate a status-dependent output signal, wherein the status acquisition unit is configured to be at least partially deactivated.

2. The system of claim 1, wherein the status acquisition unit comprises at least one magnetic field sensor configured to acquire at least one magnetic field characteristic.

3. The system of claim 2, wherein the status-dependent output signal is dependent on a threshold value, on a change in a magnetic field characteristic acquired by the at least one magnetic field sensor, or the threshold value and the change in a magnetic field characteristic acquired by the at least one magnetic field sensor.

4. The system of claim 2, wherein the at least one magnetic field sensor comprises at least one reed contact, at least one Hall sensor, at least one induction coil, or a combination thereof.

5. The system of claim 1, wherein the status acquisition unit further comprises an output unit configured to output the status-dependent output signal.

6. The system of claim 1, wherein the status-dependent output signal is an optical signal, an acoustic signal, or an optical signal and an acoustic signal.

7. The system of claim 2, wherein the status-dependent output signal is based on the at least one magnetic field characteristic.

8. The system of claim 1, wherein the status acquisition unit further comprises a connection status acquisition unit configured to acquire a connection status of the RF coil.

9. The system of claim 1, wherein the status acquisition unit further comprises an energy storage device.

10. The system of claim 1, wherein the status acquisition unit is configured to perform a discontinuous acquisition.

11. The system of claim 1, wherein the status acquisition unit is configured so that the status-dependent output signal is suspended for a time following an acquisition of a change in status of the RF coil.

12. The system of claim 1, wherein the status acquisition unit further comprises an output unit configured to generate the status-dependent output signal and to communicate the status-dependent output signal to an external receiver unit of the magnetic resonance device.

13. The system of claim 1, wherein the status acquisition unit further comprises a temperature status sensor.

14. A method for status acquisition of a RF coil on or in a magnetic resonance device, the method comprising:
    acquiring at least one signal which characterizes a status of the RF coil;
    generating a status-dependent output signal; wherein the status-dependent output signal is based on the at least one signal; and
    suspending the status-dependent output signal for a time following an acquisition of a change in status of the RF coil.

15. The method of claim 14, wherein the at least one signal is based on a magnetic field characteristic.

16. The method of claim 14, wherein the at least one signal is based on a connection status of the RF coil.

17. The method of claim 14, wherein the status-dependent output signal is only generated when the RF coil is not connected and the signal dependent on a magnetic field characteristic exceeds at least one threshold value.

18. The method of claim 14 wherein acquiring and generating are repeated.

19. A magnetic resonance device comprising:
    a local RF coil; and
    a status acquisition unit arranged on the local RF coil, wherein the status acquisition unit is configured to acquire a status of the local RF coil and to generate a status-dependent output signal, wherein the status acquisition unit is configured to perform a discontinuous acquisition.

20. The magnetic resonance device of claim 19, further comprising:
    a receive unit, wherein the receive unit is configured to receive the status-dependent output signal.

* * * * *